US012665415B2

(12) United States Patent
Chen et al.

(10) Patent No.: US 12,665,415 B2
(45) Date of Patent: Jun. 23, 2026

(54) ELECTROSTATIC DISCHARGE PROTECTION DEVICE

(71) Applicant: AMAZING MICROELECTRONIC CORP., New Taipei City (TW)

(72) Inventors: Zi-Ping Chen, New Taipei City (TW); Kun-Hsien Lin, Hsinchu City (TW); Sin-Ping Huang, New Taipei City (TW); Tun-Chih Yang, New Taipei City (TW)

(73) Assignee: AMAZING MICROELECTRONIC CORP., New Taipei City (TW)

( * ) Notice: Subject to any disclaimer, the term of this patent is extended or adjusted under 35 U.S.C. 154(b) by 185 days.

(21) Appl. No.: 18/663,268

(22) Filed: May 14, 2024

(65) Prior Publication Data

US 2025/0357754 A1    Nov. 20, 2025

(51) Int. Cl.
H02H 9/04        (2006.01)
H10D 89/60      (2025.01)

(52) U.S. Cl.
CPC ........... H02H 9/046 (2013.01); H10D 89/611 (2025.01); H10D 89/713 (2025.01)

(58) Field of Classification Search
CPC ..... H02H 9/046; H10D 89/611; H10D 89/713
USPC .......................................................... 361/56
See application file for complete search history.

(56) References Cited

U.S. PATENT DOCUMENTS

| | | | | |
|---|---|---|---|---|
| 4,567,500 A | * | 1/1986 | Avery .................... | H10D 89/60 |
| | | | | 257/539 |
| 10,141,300 B1 | * | 11/2018 | Mallikarjunaswamy .................... | |
| | | | | H10D 89/713 |
| 2015/0076557 A1 | * | 3/2015 | Salcedo ............... | H10D 18/251 |
| | | | | 257/173 |
| 2017/0069616 A1 | | 3/2017 | Cal et al. | |
| 2021/0249403 A1 | * | 8/2021 | Cheng .................... | H10D 89/00 |
| 2023/0223750 A1 | | 7/2023 | Ritter et al. | |

FOREIGN PATENT DOCUMENTS

| | | |
|---|---|---|
| TW | 591788 B | 6/2004 |
| TW | I792915 B | 2/2023 |

* cited by examiner

*Primary Examiner* — Kevin J Comber
(74) *Attorney, Agent, or Firm* — Birch, Stewart, Kolasch & Birch, LLP

(57)        ABSTRACT

An electrostatic discharge protection device includes a clamping bipolar junction transistor and at least one electrostatic discharge circuit coupled between a first-voltage rail and a second-voltage rail. The electrostatic discharge circuit includes a silicon-controlled rectifier and a diode. The anode and the cathode of the silicon-controlled rectifier are respectively coupled to an I/O port and the first-voltage rail. The cathode of the diode is coupled to the anode of the silicon-controlled rectifier and the I/O port. The anode of the diode is coupled to the second-voltage rail. The absolute value of the reverse breakdown voltage of the diode is greater than the absolute value of the anode-to-cathode trigger voltage of the silicon-controlled rectifier, which is greater than the absolute value of the trigger voltage of the clamping bipolar junction transistor.

10 Claims, 7 Drawing Sheets

ELECTROSTATIC DISCHARGE PROTECTION DEVICE

BACKGROUND OF THE INVENTION

Field of the Invention

The present invention relates to a protection device, particularly to an electrostatic discharge protection device.

Description of the Related Art

Because the IC device sizes have been shrunk to nanometer scale, the consumer electronics, like the laptop and mobile devices, have been designed to be much smaller than ever. Without suitable protection devices, the functions of these electronics could be reset or even damaged under ESD (Electro-static Discharge) events. Currently, all consumer electron ICs are expected to pass the ESD test requirement of IEC 61000-4-2 standard. Therefore, ESD protection device is necessary to bypass the ESD energy, so that the electronic systems can be prevented from ESD damages. Now Universal Serial Bus (USB) Type-C port is widely used on the electronic systems. For the pin configurations of USB Type-C port, the CC (Configuration Channel) pins and SBU (Side Band Use) pins are next to the VBUS (Voltage Bus) pin. The VBUS pin can reach up to a high voltage, for example, 20V~48V. If the USB plug is removed with an angle, it might cause the VBUS pin to short with CC or SBU pins and the CC or SBU pins will be exposed to this high voltage. In this case, the ESD protection device with a minimum breakdown voltage over this high voltage is required to protect the CC and SBU pins. FIG. 1 is a schematic diagram illustrating a conventional electrostatic discharge (ESD) protection device. Referring to FIG. 1, an electrostatic discharge protection device 1 includes a bipolar junction transistor 10 and diodes 11 and 12. The bipolar junction transistor 10 is coupled between a voltage Vdd and a voltage Vss. There is an input/output (I/O) port 13 coupled between the anode of the diode 11 and the cathode of the diode 12. For CC and SBU pins, the voltage of Vdd is 5V and Vss is 0V, thus the ESD protection device 1 will be triggered-on, when CC or SBU pins are exposed to a high voltage, for example, 20V~48V. Therefore, ESD protection device 1 can't be used for CC and SBU pins.

To overcome the abovementioned problems, the present invention provides an electrostatic discharge protection device, so as to solve the afore-mentioned problems of the prior art.

SUMMARY OF THE INVENTION

The present invention provides an electrostatic discharge protection device, which can sustain high voltage without being triggered on during misoperation and improve ESD performance with low capacitance, thereby using for high-speed interfaces.

In an embodiment of the present invention, an electrostatic discharge protection device includes a clamping bipolar junction transistor and at least one electrostatic discharge circuit. The clamping bipolar junction transistor is coupled between a first-voltage rail and a second-voltage rail. The electrostatic discharge circuit, coupled between the first-voltage rail and the second-voltage rail and coupled to an input/output (I/O) port, includes a silicon-controlled rectifier and a diode. The anode of the silicon-controlled rectifier is coupled to the I/O port. The cathode of the silicon-controlled rectifier is coupled to the first-voltage rail. The cathode of the diode is coupled to the anode of the silicon-controlled rectifier and the I/O port. The anode of the diode is coupled to the second-voltage rail. The absolute value of the reverse breakdown voltage of the diode is greater than the absolute value of the anode-to-cathode trigger voltage of the silicon-controlled rectifier and the absolute value of the anode-to-cathode trigger voltage of the silicon-controlled rectifier is greater than the absolute value of the trigger voltage of the clamping bipolar junction transistor. The silicon-controlled rectifier includes a parasitic PNP bipolar junction transistor and a parasitic NPN bipolar junction transistor. The base of the parasitic PNP bipolar junction transistor is decoupled to the I/O port.

In an embodiment of the present invention, the at least one electrostatic discharge circuit includes a plurality of electrostatic discharge circuits.

In an embodiment of the present invention, the clamping bipolar junction transistor is an NPN bipolar junction transistor whose base is electrically floating, an NPN bipolar junction transistor whose emitter is coupled to its base, a PNP bipolar junction transistor whose base is electrically floating, or a PNP bipolar junction transistor whose emitter is coupled to its base.

In an embodiment of the present invention, the first-voltage rail is electrically floating.

In an embodiment of the present invention, the silicon-controlled rectifier includes an N-type semiconductor substrate, a first P-type well, a first P-type heavily-doped area, a first N-type heavily-doped area, and a second P-type heavily-doped area. The N-type semiconductor substrate is decoupled to the I/O port. The first P-type well is formed in the N-type semiconductor substrate. The first P-type heavily-doped area and the first N-type heavily-doped area are formed in the first P-type well and coupled to the first-voltage rail. The second P-type heavily-doped area, formed in the N-type semiconductor substrate and coupled to the I/O port and the cathode of the diode, directly interfaces the N-type semiconductor substrate. The first P-type heavily-doped area, the first P-type well, the N-type semiconductor substrate, and the second P-type heavily-doped area form the parasitic PNP bipolar junction transistor. The first N-type heavily-doped area, the first P-type well, and the N-type semiconductor substrate form the parasitic NPN bipolar junction transistor. The clamping bipolar junction transistor and the diode are formed in the N-type semiconductor substrate. The diode is formed between the clamping bipolar junction transistor and each of the first P-type well and the second P-type heavily-doped area.

The diode includes a second P-type well, a second N-type heavily-doped area, and a third P-type heavily-doped area. The second P-type well is formed in the N-type semiconductor substrate. The second N-type heavily-doped area and the third P-type heavily-doped area are formed in the second P-type well. The second N-type heavily-doped area is coupled to the second P-type heavily-doped area and the I/O port and the third P-type heavily-doped area is coupled to the second-voltage rail.

The clamping bipolar junction transistor includes a third P-type well, a third N-type heavily-doped area, and a fourth N-type heavily-doped area. The third P-type well is formed in the N-type semiconductor substrate. The third N-type heavily-doped area and the fourth N-type heavily-doped area are formed in the third P-type well and respectively coupled to the second-voltage rail and the first-voltage rail.

In an embodiment of the present invention, the doping concentration of the third P-type well is greater than that of the first P-type well. The doping concentration of the first P-type well is greater than that of the second P-type well.

In an embodiment of the present invention, the electrostatic discharge protection device further includes a semiconductor substrate, at least one first isolation trench, and at least one second isolation trench. The silicon-controlled rectifier includes an N-type epitaxial layer, a first P-type well, a first P-type heavily-doped area, a first N-type heavily-doped area, and a second P-type heavily-doped area. The N-type epitaxial layer is formed on the semiconductor substrate. The first isolation trench and the second isolation trench, formed in the N-type epitaxial layer and the semiconductor substrate, divides the N-type epitaxial layer into at least one first N-type epitaxial region, at least one second N-type epitaxial region, and a third N-type epitaxial region. The diode and the clamping bipolar junction transistor are respectively formed in the second N-type epitaxial region and the third N-type epitaxial region. The first N-type epitaxial region is decoupled to the I/O port. The first P-type well is formed in the first N-type epitaxial region. The first P-type heavily-doped area and the first N-type heavily-doped area are formed in the first P-type well and coupled to the first-voltage rail. The second P-type heavily-doped area, formed in the first N-type epitaxial region and coupled to the I/O port and the cathode of the diode, directly interfaces the first N-type epitaxial region. The first P-type heavily-doped area, the first P-type well, the first N-type epitaxial region, and the second P-type heavily-doped area form the parasitic PNP bipolar junction transistor. The first N-type heavily-doped area, the first P-type well, and the first N-type epitaxial region form the parasitic NPN bipolar junction transistor.

The diode includes a second P-type well, a second N-type heavily-doped area, and a third P-type heavily-doped area. The second P-type well is formed in the second N-type epitaxial region. The second N-type heavily-doped area and the third P-type heavily-doped area are formed in the second P-type well. The second N-type heavily-doped area is coupled to the second P-type heavily-doped area and the I/O port. The third P-type heavily-doped area is coupled to the second-voltage rail.

The clamping bipolar junction transistor includes a third P-type well, a third N-type heavily-doped area, and a fourth N-type heavily-doped area. The third P-type well is formed in the third N-type epitaxial region. The third N-type heavily-doped area and the fourth N-type heavily-doped area are formed in the third P-type well and respectively coupled to the second-voltage rail and the first-voltage rail.

In an embodiment of the present invention, the doping concentration of the third P-type well is greater than that of the first P-type well and the doping concentration of the first P-type well is greater than that of the second P-type well.

In an embodiment of the present invention, the electrostatic discharge protection device further includes a semiconductor substrate, at least one first isolation trench, and at least one second isolation trench. The silicon-controlled rectifier includes an N-type epitaxial layer, a first P-type well, a first P-type heavily-doped area, a first N-type heavily-doped area, and a second P-type heavily-doped area. The N-type epitaxial layer is formed on the semiconductor substrate. The first isolation trench and the second isolation trench, formed in the N-type epitaxial layer and the semiconductor substrate, divides the N-type epitaxial layer into at least one first N-type epitaxial region, at least one second N-type epitaxial region, and a third N-type epitaxial region. The diode and the clamping bipolar junction transistor are respectively formed in the second N-type epitaxial region and the third N-type epitaxial region. The first N-type epitaxial region is decoupled to the I/O port. The first P-type well is formed in the first N-type epitaxial region. The first P-type heavily-doped area and the first N-type heavily-doped area are formed in the first P-type well and coupled to the first-voltage rail. The second P-type heavily-doped area, formed in the first N-type epitaxial region and coupled to the I/O port and the cathode of the diode, directly interfaces the first N-type epitaxial region. The first P-type heavily-doped area, the first P-type well, the first N-type epitaxial region, and the second P-type heavily-doped area form the parasitic PNP bipolar junction transistor. The first N-type heavily-doped area, the first P-type well, and the first N-type epitaxial region form the parasitic NPN bipolar junction transistor.

The diode includes a second P-type well, a second N-type heavily-doped area, and a third P-type heavily-doped area. The second P-type well is formed in the second N-type epitaxial region. The second N-type heavily-doped area and the third P-type heavily-doped area are respectively formed in the second N-type epitaxial region and the second P-type well. The second N-type heavily-doped area is coupled to the second P-type heavily-doped area and the I/O port and the third P-type heavily-doped area is coupled to the second-voltage rail.

The clamping bipolar junction transistor includes a third P-type well, a third N-type heavily-doped area, and a fourth N-type heavily-doped area. The third P-type well is formed in the third N-type epitaxial region. The third N-type heavily-doped area and the fourth N-type heavily-doped area are formed in the third P-type well and respectively coupled to the second-voltage rail and the first-voltage rail.

In an embodiment of the present invention, the doping concentration of the third P-type well is greater than that of the first P-type well and the doping concentration of the first P-type well is greater than that of the second P-type well.

To sum up, the electrostatic discharge protection device sets the absolute value of the reverse breakdown voltage of the diode greater than the absolute value of the anode-to-cathode trigger voltage of the silicon-controlled rectifier and the absolute value of the anode-to-cathode trigger voltage of the silicon-controlled rectifier greater than the absolute value of the trigger voltage of the clamping bipolar junction transistor to sustain high voltage without being triggered on during misoperation and improve ESD performance with low capacitance.

Below, the embodiments are described in detail in cooperation with the drawings to make easily understood the technical contents, characteristics and accomplishments of the present invention.

DETAILED DESCRIPTION OF THE INVENTION

Figure 1:
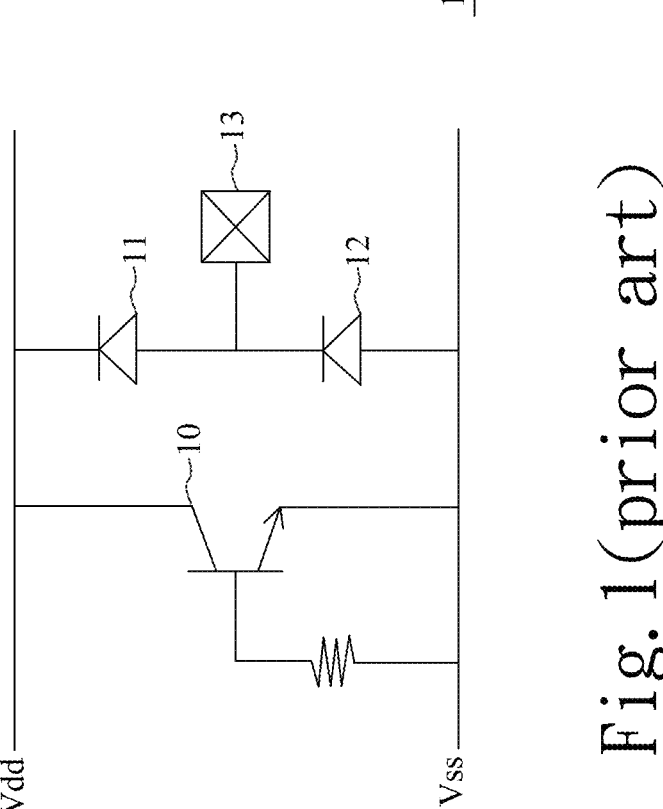
FIG. 1 is a schematic diagram illustrating a conventional electrostatic discharge protection device.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/ without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

In the following description, an electrostatic discharge (ESD) protection will be provided, which sets the absolute value of the reverse breakdown voltage of the diode greater than the absolute value of the anode-to-cathode trigger voltage of the silicon-controlled rectifier and the absolute value of the anode-to-cathode trigger voltage of the silicon-controlled rectifier greater than the absolute value of the trigger voltage of the clamping bipolar junction transistor to sustain high voltage without being triggered on during misoperation and improve ESD performance with low capacitance.

Figure 2:
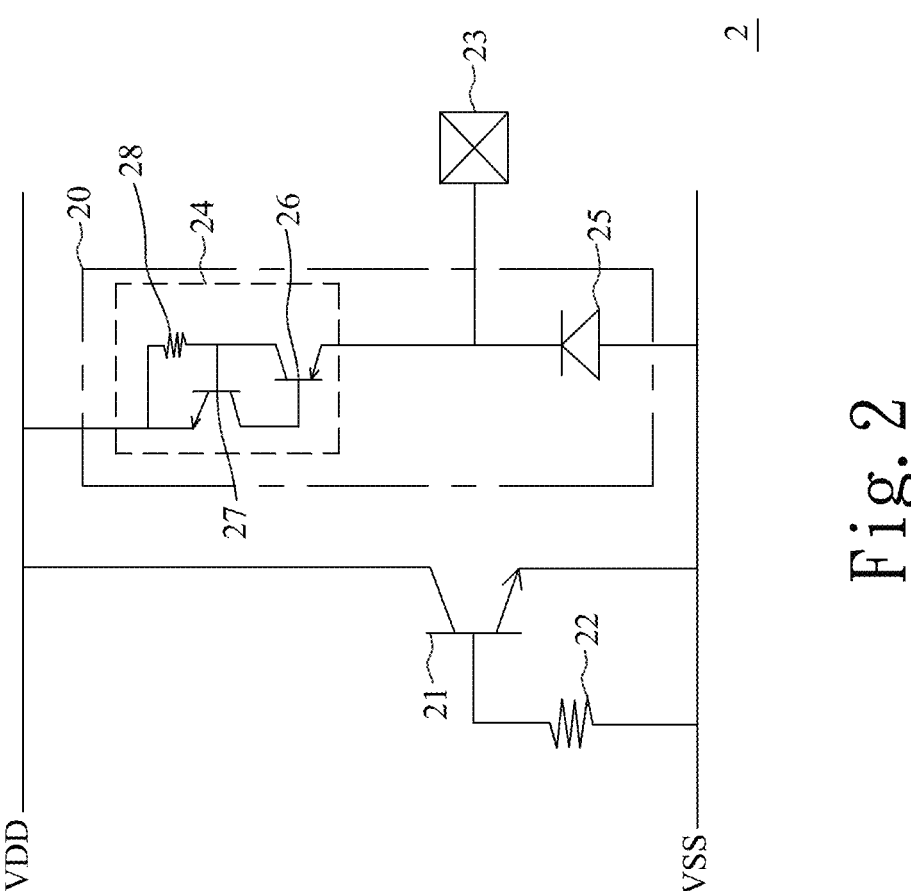
FIG. 2 is a schematic diagram illustrating an electrostatic discharge protection device according to a first embodiment of the present invention.
Figure 3:
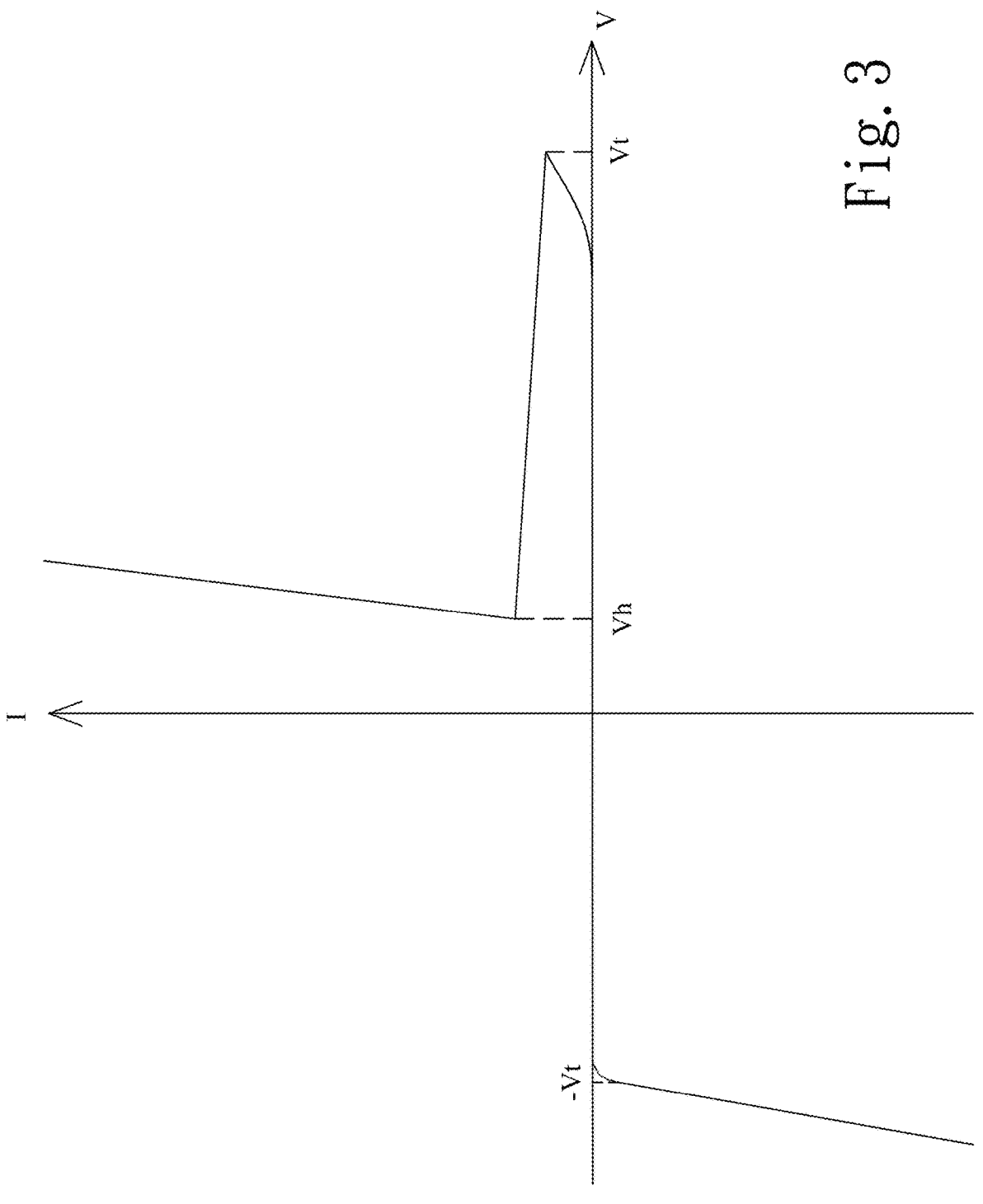
FIG. 3 is a schematic diagram illustrating a current-voltage curve of a silicon-controlled rectifier according to an embodiment of the present invention.

FIG. 2 is a schematic diagram illustrating an electrostatic discharge protection device according to a first embodiment of the present invention. FIG. 3 is a schematic diagram illustrating a current-voltage curve of a silicon-controlled rectifier according to an embodiment of the present invention. Referring to FIG. 2, the first embodiment of an electrostatic discharge (ESD) protection device 2 is introduced as follows. The ESD protection device 2 includes a clamping bipolar junction transistor 21 and at least one electrostatic discharge circuit 20. For convenience and clarity, the first embodiment exemplifies one electrostatic discharge circuit 21. The clamping bipolar junction transistor 21 is coupled between a first-voltage rail and a second-voltage rail. The first-voltage rail and the second-voltage rail are respectively a high-voltage rail and a low-voltage rail due to power-on mode. The voltage of the high-voltage rail is represented with VDD. The voltage of the low-voltage rail is represented with VSS. The clamping bipolar junction transistor 21 may be an NPN bipolar junction transistor whose base is electrically floating, an NPN bipolar junction transistor whose emitter is coupled to its base, a PNP bipolar junction transistor whose base is electrically floating, or a PNP bipolar junction transistor whose emitter is coupled to its base. In the first embodiment, the clamping bipolar junction transistor 21 may have a parasitic resistor 22. The base of the clamping bipolar junction transistor 21 is coupled to the emitter of the clamping bipolar junction transistor 21 through the parasitic resistor 22.

The electrostatic discharge circuit 20, coupled between the first-voltage rail and the second-voltage rail and coupled to an input/output (I/O) port 23, includes a silicon-controlled rectifier 24 and a diode 25. The anode of the silicon-controlled rectifier 24 is coupled to the I/O port 23. The cathode of the silicon-controlled rectifier 24 is coupled to the first-voltage rail. The cathode of the diode 25 is coupled to the anode of the silicon-controlled rectifier 24 and the I/O port 23. The anode of the diode 25 is coupled to the second-voltage rail. Refer to FIG. 2 and FIG. 3, the absolute value of the anode-to-cathode trigger voltage Vt of the silicon-controlled rectifier 24 is greater than the absolute value of the trigger voltage of the clamping bipolar junction transistor 21 and the anode-to-cathode holding voltage Vh of the silicon-controlled rectifier 24. As a result, the electrostatic discharge protection device 2 can sustain high voltage without being triggered on when I/O port 23 is exposed to high voltage. In order to prevent an ESD current from flowing from the I/O port 23 to the second-voltage rail and cause damage to the diode 25, the absolute value of the reverse breakdown voltage of the diode 25 is greater than the absolute value of the anode-to-cathode trigger voltage Vt of the silicon-controlled rectifier 24. The silicon-controlled rectifier 24 includes a parasitic PNP bipolar junction transistor 26 and a parasitic NPN bipolar junction transistor 27. The base of the parasitic PNP bipolar junction transistor 26 is electrically floating and decoupled to the I/O port 23. Accordingly, the input capacitance of the electrostatic discharge protection device 2 can be reduced. In general, the input capacitance may be a range of 0.2~5 pF, but the present invention is not limited thereto. In addition, the cathode-to-anode characteristic of the silicon-controlled rectifier 24 presents non-significant snapback current-voltage curve and trigger voltage—Vt whose absolute value is high. In other embodiments, the silicon-controlled rectifier 24 further includes a parasitic resistor 28 coupled between the base and the emitter of the parasitic NPN bipolar junction transistor 27. When a positive ESD event occurs at the I/O port 23, an ESD current flows from the I/O port 23 to the second-voltage rail through the silicon-controlled rectifier 24 and the clamping bipolar junction transistor 21. In other embodiments, the first-voltage rail may be electrically floating due to power-down mode.

As a result, the electrostatic discharge protection device 2 can be applied to the CC (Configuration Channel) and SBU (Side Band Use) pins of USB Type-C port. When CC or SBU pins are exposed to the high voltage of VBUS (Voltage Bus) pin during misoperation, the electrostatic discharge protection device 2 can sustain high voltage without being triggered on and improve ESD performance with low capacitance.

Figure 4:
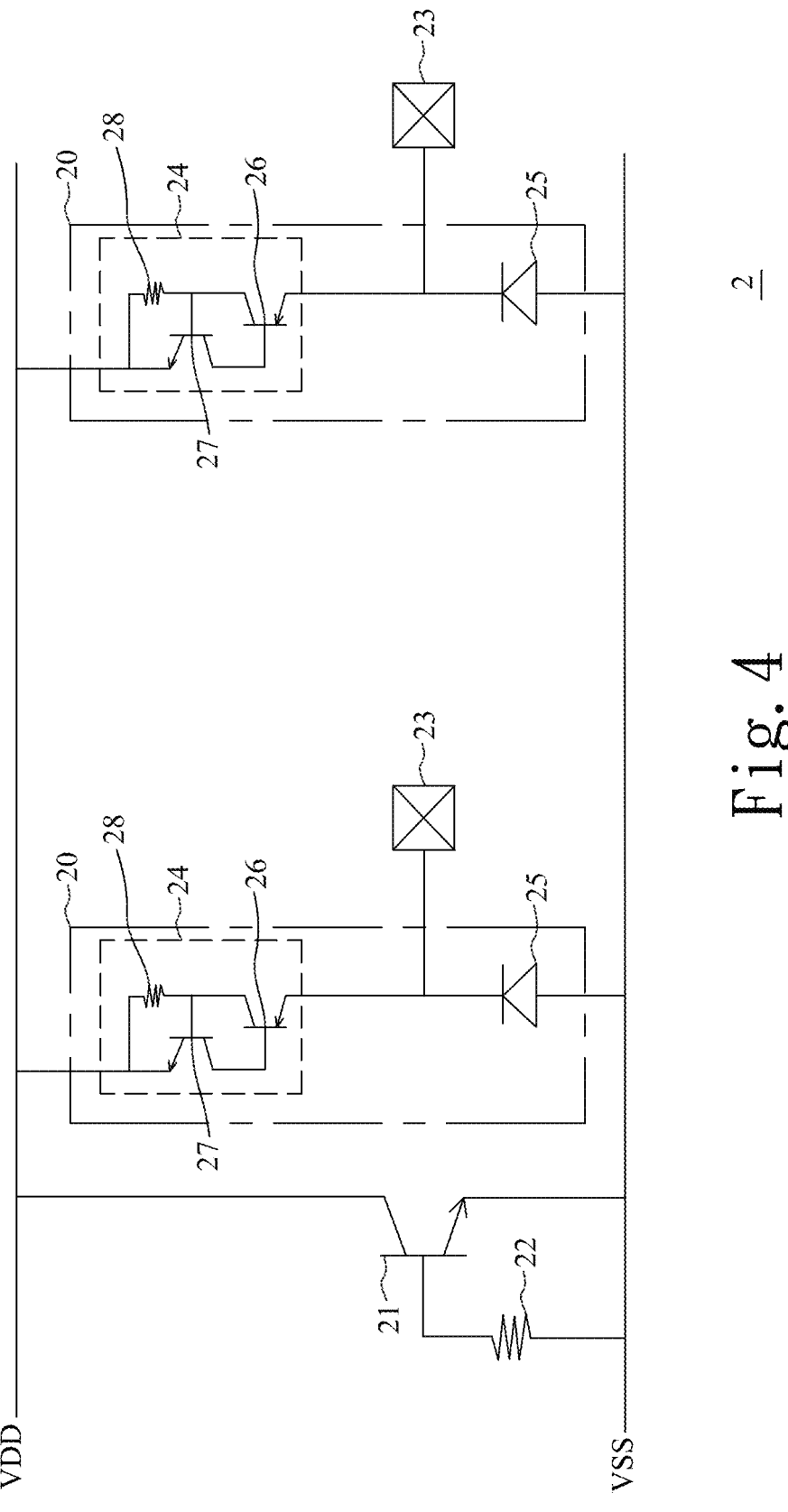
FIG. 4 is a schematic diagram illustrating an electrostatic discharge protection device according to a second embodiment of the present invention.

FIG. 4 is a schematic diagram illustrating an electrostatic discharge protection device according to a second embodiment of the present invention. Referring to FIG. 4, the second embodiment of the ESD protection device 2 is introduced as follows. The first embodiment is different from the second embodiment in that the second embodiment of the ESD protection device 2 includes a plurality of electrostatic discharge circuits 20. Since the cathode-to-anode characteristic of the silicon-controlled rectifier 24 presents high trigger voltage, an ESD current difficultly flows from the left I/O port 23 to the right I/O port 23 through the right silicon-controlled rectifiers 24 to avoid causing damage to the right silicon-controlled rectifier 24. When the ESD current flows from the left I/O port 23 to the right I/O port 23, the ESD endurance can be improved. When a positive ESD event occurs at the left I/O port 23 and the right I/O port 23 is relative grounding, an ESD current flows from the left I/O port 23 to the right I/O port 23 through the left silicon-controlled rectifier 24, the clamping bipolar junction transistor 21, and the right diode 25.

Figure 5:
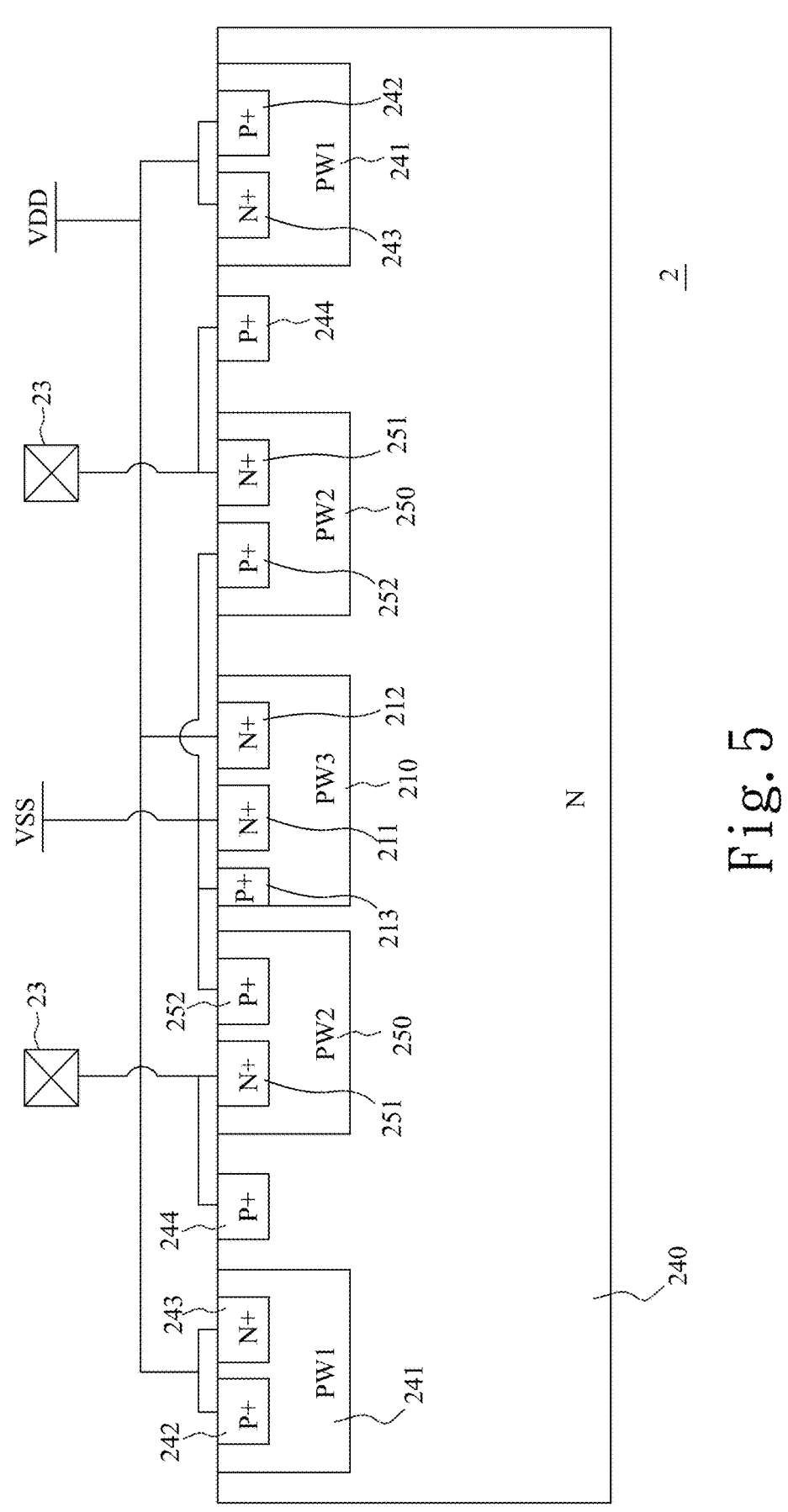
FIG. 5 is a cross-sectional view of an electrostatic discharge protection device according to an embodiment of the present invention.

FIG. 5 is a cross-sectional view of an electrostatic discharge protection device according to an embodiment of the present invention. Referring to FIG. 4 and FIG. 5, the silicon-controlled rectifier 24 may include an N-type semiconductor substrate 240, a first P-type well 241, a first P-type heavily-doped area 242, a first N-type heavily-doped area 243, and a second P-type heavily-doped area 244. The N-type semiconductor substrate 240 is electrically floating. The first P-type well 241 is formed in the N-type semiconductor substrate 240. The first P-type heavily-doped area 242 and the first N-type heavily-doped area 243 are formed in the first P-type well 241 and coupled to the first-voltage rail. The second P-type heavily-doped area 244 is formed in the N-type semiconductor substrate 240 and coupled to the I/O port 23 and the cathode of the diode 25. The second P-type heavily-doped area 244 may directly interface the N-type semiconductor substrate 240. The first P-type heavily-doped area 242, the first P-type well 241, the N-type semiconductor substrate 240, and the second P-type heavily-doped area 244 form the parasitic PNP bipolar junction transistor 26. The first N-type heavily-doped area 243, the first P-type well 241, and the N-type semiconductor substrate 240 form the parasitic NPN bipolar junction transistor 27. The first P-type well 241 forms the parasitic resistor 28. The clamping bipolar junction transistor 21 and the diode 25 are formed in the N-type semiconductor substrate 240. The diode 25 is formed between the clamping bipolar junction transistor 21 and each of the first P-type well 241 and the second P-type heavily-doped area 244 in order to suppress a parasitic silicon-controlled rectifier (SCR) path from the I/O port 23 to the second-voltage rail and improve the ESD endurance.

The diode 25 may include a second P-type well 250, a second N-type heavily-doped area 251, and a third P-type heavily-doped area 252. The second P-type well 250 is formed in the N-type semiconductor substrate 240. The second N-type heavily-doped area 251 and the third P-type heavily-doped area 252 are formed in the second P-type well 250. The second N-type heavily-doped area 251 is coupled to the second P-type heavily-doped area 244 and the I/O port 23. The third P-type heavily-doped area 252 is coupled to the second-voltage rail.

The clamping bipolar junction transistor 21 may include a third P-type well 210, a third N-type heavily-doped area 211, a fourth N-type heavily-doped area 212, and a fourth P-type heavily-doped area 213. The third P-type well 210 is formed in the N-type semiconductor substrate 240. The third N-type heavily-doped area 211 and the fourth N-type heavily-doped area 212 are formed in the third P-type well 210 and respectively coupled to the second-voltage rail and the first-voltage rail. The fourth P-type heavily-doped area 213, formed in the third P-type well 210 and coupled to the third N-type heavily-doped area 211, forms the parasitic resistor 22. In order to sets the absolute value of the reverse breakdown voltage of the diode 25 greater than the absolute value of the anode-to-cathode trigger voltage of the silicon-controlled rectifier 24 and the absolute value of the anode-to-cathode trigger voltage of the silicon-controlled rectifier 24 greater than the absolute value of the trigger voltage of the clamping bipolar junction transistor 21, the doping concentration of the third P-type well 210 is greater than that of the first P-type well 241 and the doping concentration of the first P-type well 241 is greater than that of the second P-type well 250.

Figure 6:
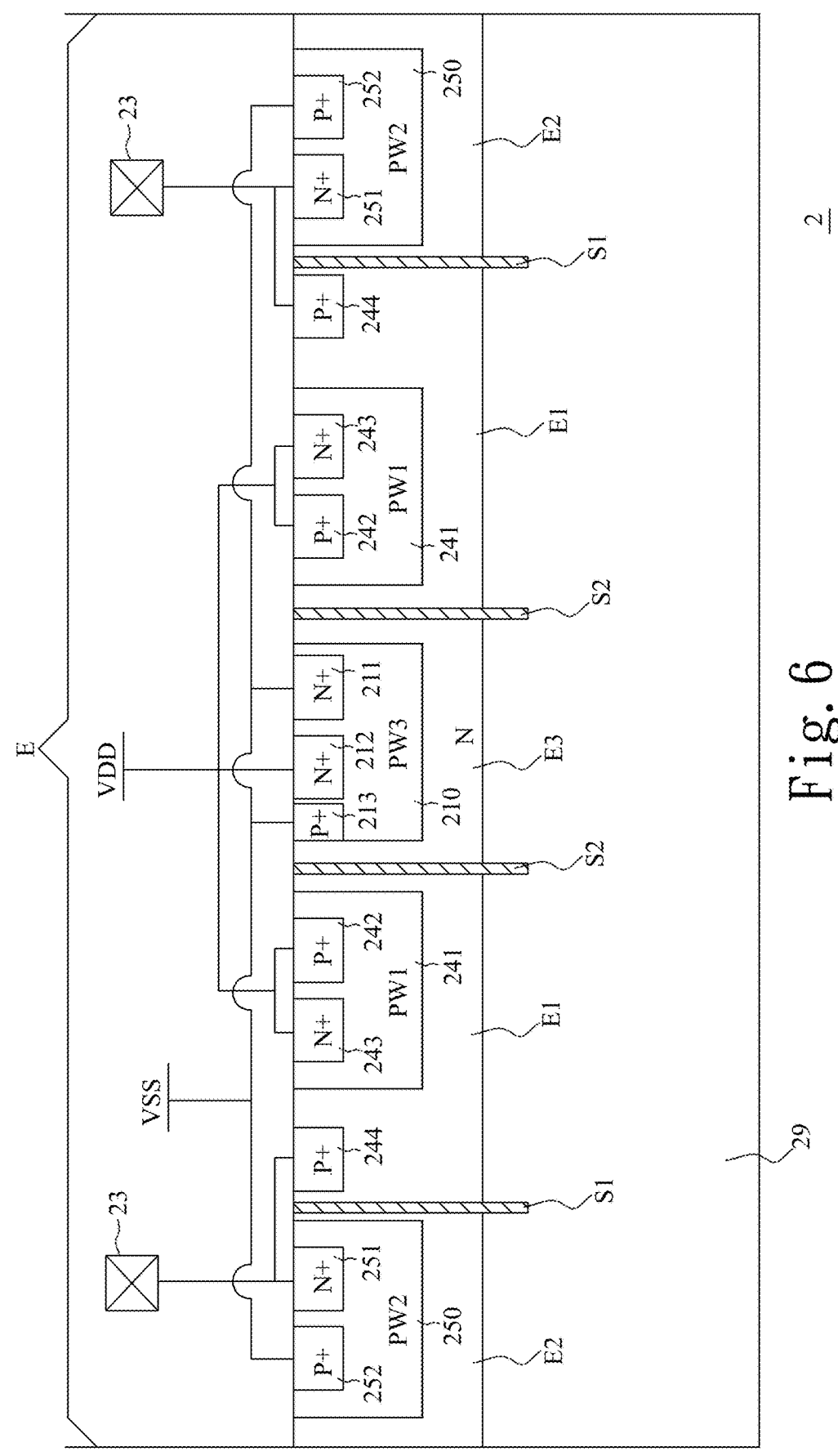
FIG. 6 is a cross-sectional view of an electrostatic discharge protection device according to another embodiment of the present invention.

FIG. 6 is a cross-sectional view of an electrostatic discharge protection device according to another embodiment of the present invention. Referring to FIG. 4 and FIG. 6, the electrostatic discharge protection device 2 further includes a semiconductor substrate 29, at least one first isolation trench S1, and at least one second isolation trench S2. The semiconductor substrate 29 has an N type, a P type, or an intrinsic type. The first isolation trench S1 and the second isolation trench S2 include insulating materials. For convenience and clarity, the number of the first isolation trenches S1 is two and the number of the second isolation trenches S2 is two. The silicon-controlled rectifier 24 may include an N-type epitaxial layer E, a first P-type well 241, a first P-type heavily-doped area 242, a first N-type heavily-doped area 243, and a second P-type heavily-doped area 244. The N-type epitaxial layer E is formed on the semiconductor substrate 29. The first isolation trench S1 and the second isolation trench S2, formed in the N-type epitaxial layer E and the semiconductor substrate 29, divides the N-type epitaxial layer E into at least one first N-type epitaxial region E1, at least one second N-type epitaxial region E2, and a third N-type epitaxial region E3. The first isolation trench S1 and the second isolation trench S2 are used to suppress a parasitic silicon-controlled rectifier (SCR) path from the I/O port 23 to the second-voltage rail and improve the ESD endurance. In the embodiment, there are two first N-type epitaxial regions E1 and two second N-type epitaxial regions E2. The diode 25 and the clamping bipolar junction transistor 21 are respectively formed in the second N-type epitaxial region E2 and the third N-type epitaxial region E3. The first N-type epitaxial region E1 is decoupled to the I/O port 23. The first P-type well 241 is formed in the first N-type epitaxial region E1. The first P-type heavily-doped area 242 and the first N-type heavily-doped area 243 are formed in the first P-type well 241 and coupled to the first-voltage rail. The second P-type heavily-doped area 244 is formed in the first N-type epitaxial region E1 and coupled to the I/O port 23 and the cathode of the diode 25. The second P-type heavily-doped area 244 may directly interface the first N-type epitaxial region E1. The first P-type heavily-doped area 242, the first P-type well 241, the first N-type epitaxial region E1, and the second P-type heavily-doped area 244 form the parasitic PNP bipolar junction transistor 26. The first N-type heavily-doped area 243, the first P-type well 241, and the first N-type epitaxial region E1 form the parasitic NPN bipolar junction transistor 27. The first P-type well 241 forms the parasitic resistor 28.

The diode 25 may include a second P-type well 250, a second N-type heavily-doped area 251, and a third P-type heavily-doped area 252. The second P-type well 250 is formed in the second N-type epitaxial region E2. The second N-type heavily-doped area 251 and the third P-type heavily-doped area 252 are formed in the second P-type well 250. The second N-type heavily-doped area 251 is coupled to the second P-type heavily-doped area 244 and the I/O port 23. The third P-type heavily-doped area 252 is coupled to the second-voltage rail.

The clamping bipolar junction transistor 21 may include a third P-type well 210, a third N-type heavily-doped area 211, a fourth N-type heavily-doped area 212, and a fourth P-type heavily-doped area 213. The third P-type well 210 is formed in the third N-type epitaxial region E3. The third N-type heavily-doped area 211 and the fourth N-type heavily-doped area 212 are formed in the third P-type well 210 and respectively coupled to the second-voltage rail and the first-voltage rail. The fourth P-type heavily-doped area 213, formed in the third P-type well 210 and coupled to the third N-type heavily-doped area 211, forms the parasitic resistor 22. In order to sets the absolute value of the reverse breakdown voltage of the diode 25 greater than the absolute value of the anode-to-cathode trigger voltage of the silicon-controlled rectifier 24 and the absolute value of the anode-to-cathode trigger voltage of the silicon-controlled rectifier 24 greater than the absolute value of the trigger voltage of the clamping bipolar junction transistor 21, the doping concentration of the third P-type well 210 is greater than that of the first P-type well 241 and the doping concentration of the first P-type well 241 is greater than that of the second P-type well 250.

Figure 7:
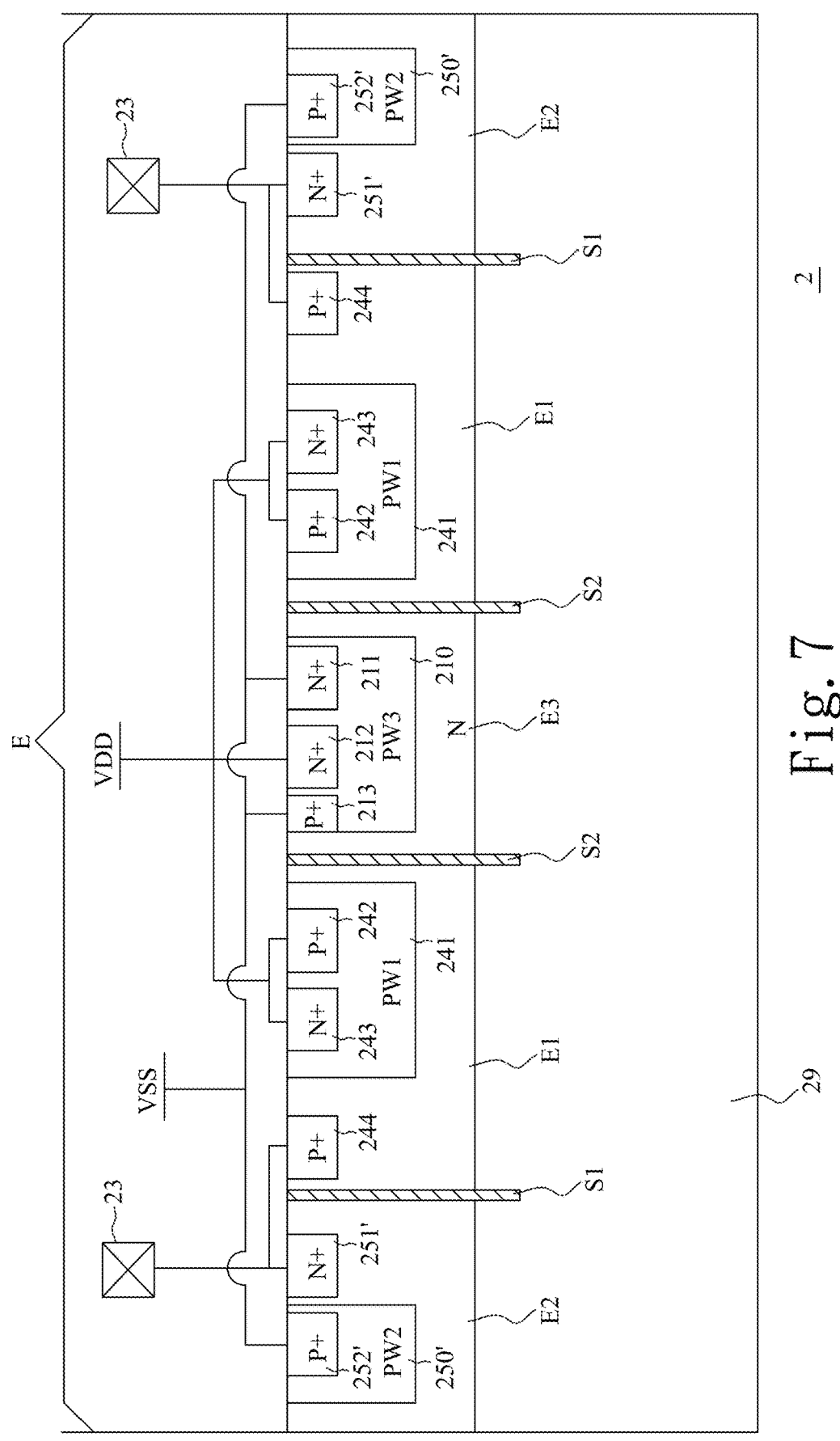
FIG. 7 is a cross-sectional view of an electrostatic discharge protection device according to yet another embodiment of the present invention.

FIG. 7 is a cross-sectional view of an electrostatic discharge protection device according to yet another embodiment of the present invention. Referring to FIG. 4 and FIG. 7, the embodiment of FIG. 6 is different from the embodiment of FIG. 7 in the diode 25. In the embodiment of FIG. 7, the diode 25 may include a second P-type well 250', a second N-type heavily-doped area 251', and a third P-type heavily-doped area 252'. The second P-type well 250' is formed in the second N-type epitaxial region E2. The second N-type heavily-doped area 251' and the third P-type heavily-doped area 252' are respectively formed in the second N-type epitaxial region E2 and the second P-type well 250'. The second N-type heavily-doped area 251' is coupled to the second P-type heavily-doped area 244 and the I/O port 23 and the third P-type heavily-doped area 252' is coupled to the second-voltage rail. The embodiment of FIG. 7 is used to further increase the absolute value of the reverse breakdown voltage of the diode 25. The other structures of the embodiment of FIG. 7 have been described previously so it will not be reiterated.

According to the embodiments provided above, the electrostatic discharge protection device sustains high voltage without being triggered on during misoperation and improves ESD performance with low capacitance.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An electrostatic discharge protection device comprising:

a clamping bipolar junction transistor coupled between a first-voltage rail and a second-voltage rail; and at least one electrostatic discharge circuit, coupled between the first-voltage rail and the second-voltage rail and coupled to an input/output (I/O) port, comprising:

a silicon-controlled rectifier with an anode thereof coupled to the I/O port, and a cathode of the silicon-controlled rectifier is coupled to the first-voltage rail; and a diode with a cathode thereof coupled to the anode of the silicon-controlled rectifier and the I/O port, and an anode of the diode is coupled to the second-voltage rail;

wherein an absolute value of a reverse breakdown voltage of the diode is greater than an absolute value of an anode-to-cathode trigger voltage of the silicon-controlled rectifier and the absolute value of the anode-to-cathode trigger voltage of the silicon-controlled rectifier is greater than an absolute value of a trigger voltage of the clamping bipolar junction transistor;

wherein the silicon-controlled rectifier includes a parasitic PNP bipolar junction transistor and a parasitic NPN bipolar junction transistor and a base of the parasitic PNP bipolar junction transistor is decoupled to the I/O port.

2. The electrostatic discharge protection device according to claim 1, wherein the at least one electrostatic discharge circuit comprises a plurality of electrostatic discharge circuits.

3. The electrostatic discharge protection device according to claim 1, wherein the clamping bipolar junction transistor is an NPN bipolar junction transistor whose base is electrically floating, an NPN bipolar junction transistor whose emitter is coupled to its base, a PNP bipolar junction transistor whose base is electrically floating, or a PNP bipolar junction transistor whose emitter is coupled to its base.

4. The electrostatic discharge protection device according to claim 1, wherein the first-voltage rail is electrically floating.

5. The electrostatic discharge protection device according to claim 1, wherein the silicon-controlled rectifier comprises:

an N-type semiconductor substrate decoupled to the I/O port;

a first P-type well formed in the N-type semiconductor substrate;

a first P-type heavily-doped area and a first N-type heavily-doped area formed in the first P-type well and coupled to the first-voltage rail; and a second P-type heavily-doped area formed in the N-type semiconductor substrate and coupled to the I/O port and the cathode of the diode, wherein the first P-type heavily-doped area, the first P-type well, the N-type semiconductor substrate, and the second P-type heavily-doped area form the parasitic PNP bipolar junction transistor, the first N-type heavily-doped area, the first P-type well, and the N-type semiconductor substrate form the parasitic NPN bipolar junction transistor, the clamping bipolar junction transistor and the diode are formed in the N-type semiconductor substrate, and the diode is formed between the clamping bipolar junction transistor and each of the first P-type well and the second P-type heavily-doped area;

wherein the diode comprises:

a second P-type well formed in the N-type semiconductor substrate; and a second N-type heavily-doped area and a third P-type heavily-doped area formed in the second P-type well, wherein the second N-type heavily-doped area is coupled to the second P-type heavily-doped area and the I/O port and the third P-type heavily-doped area is coupled to the second-voltage rail;

wherein the clamping bipolar junction transistor comprises:

a third P-type well formed in the N-type semiconductor substrate; and a third N-type heavily-doped area and a fourth N-type heavily-doped area formed in the third P-type well and respectively coupled to the second-voltage rail and the first-voltage rail.

6. The electrostatic discharge protection device according to claim 5, wherein a doping concentration of the third P-type well is greater than that of the first P-type well and a doping concentration of the first P-type well is greater than that of the second P-type well.

7. The electrostatic discharge protection device according to claim 1, further comprising a semiconductor substrate, at least one first isolation trench, and at least one second isolation trench, and the silicon-controlled rectifier comprises:

an N-type epitaxial layer formed on the semiconductor substrate, wherein the at least one first isolation trench and the at least one second isolation trench, formed in the N-type epitaxial layer and the semiconductor substrate, divides the N-type epitaxial layer into at least one first N-type epitaxial region, at least one second N-type epitaxial region, and a third N-type epitaxial region, the diode and the clamping bipolar junction transistor are respectively formed in the at least one second N-type epitaxial region and the third N-type epitaxial region, and the at least one first N-type epitaxial region is decoupled to the I/O port;

a first P-type well formed in the at least one first N-type epitaxial region;

a first P-type heavily-doped area and a first N-type heavily-doped area formed in the first P-type well and coupled to the first-voltage rail; and a second P-type heavily-doped area formed in the at least one first N-type epitaxial region and coupled to the I/O port and the cathode of the diode, wherein the first P-type heavily-doped area, the first P-type well, the at least one first N-type epitaxial region, and the second P-type heavily-doped area form the parasitic PNP bipolar junction transistor, and the first N-type heavily-doped area, the first P-type well, and the at least one first N-type epitaxial region form the parasitic NPN bipolar junction transistor;

wherein the diode comprises:

a second P-type well formed in the at least one second N-type epitaxial region; and a second N-type heavily-doped area and a third P-type heavily-doped area formed in the second P-type well, wherein the second N-type heavily-doped area is coupled to the second P-type heavily-doped area and the I/O port and the third P-type heavily-doped area is coupled to the second-voltage rail;

wherein the clamping bipolar junction transistor comprises:

a third P-type well formed in the third N-type epitaxial region; and a third N-type heavily-doped area and a fourth N-type heavily-doped area formed in the third P-type well and respectively coupled to the second-voltage rail and the first-voltage rail.

8. The electrostatic discharge protection device according to claim 7, wherein a doping concentration of the third P-type well is greater than that of the first P-type well and a doping concentration of the first P-type well is greater than that of the second P-type well.

9. The electrostatic discharge protection device according to claim 1, further comprising a semiconductor substrate, at least one first isolation trench, and at least one second isolation trench, and the silicon-controlled rectifier comprises:

an N-type epitaxial layer formed on the semiconductor substrate, wherein the at least one first isolation trench and the at least one second isolation trench, formed in the N-type epitaxial layer and the semiconductor substrate, divides the N-type epitaxial layer into at least one first N-type epitaxial region, at least one second N-type epitaxial region, and a third N-type epitaxial region, the diode and the clamping bipolar junction transistor are respectively formed in the at least one second N-type epitaxial region and the third N-type epitaxial region, and the at least one first N-type epitaxial region is decoupled to the I/O port;

a first P-type well formed in the at least one first N-type epitaxial region;

a first P-type heavily-doped area and a first N-type heavily-doped area formed in the first P-type well and coupled to the first-voltage rail; and a second P-type heavily-doped area formed in the at least one first N-type epitaxial region and coupled to the I/O port and the cathode of the diode, wherein the first P-type heavily-doped area, the first P-type well, the at least one first N-type epitaxial region, and the second P-type heavily-doped area form the parasitic PNP bipolar junction transistor, and the first N-type heavily-doped area, the first P-type well, and the at least one first N-type epitaxial region form the parasitic NPN bipolar junction transistor;

wherein the diode comprises:

a second P-type well formed in the at least one second N-type epitaxial region; and a second N-type heavily-doped area and a third P-type heavily-doped area respectively formed in the at least one second N-type epitaxial region and the second P-type well, wherein the second N-type heavily-doped area is coupled to the second P-type heavily-doped area and the I/O port and the third P-type heavily-doped area is coupled to the second-voltage rail;

wherein the clamping bipolar junction transistor comprises:

a third P-type well formed in the third N-type epitaxial region; and a third N-type heavily-doped area and a fourth N-type heavily-doped area formed in the third P-type well and respectively coupled to the second-voltage rail and the first-voltage rail.

10. The electrostatic discharge protection device according to claim 9, wherein a doping concentration of the third P-type well is greater than that of the first P-type well and a doping concentration of the first P-type well is greater than that of the second P-type well.

\* \* \* \* \*